United States Patent [19]

Kovacs et al.

[11] Patent Number: 5,525,986
[45] Date of Patent: Jun. 11, 1996

[54] INTRINSIC R2R RESISTANCE LADDER DIGITAL TO ANALOG CONVERTER

[75] Inventors: Janos Kovacs; Steven R. Robinson; Wyn Palmer, all of Andover, Mass.

[73] Assignee: Analog Devices, Inc., Norwood, Mass.

[21] Appl. No.: 317,383

[22] Filed: Oct. 4, 1994

[51] Int. Cl.⁶ .................................................. H03M 1/78
[52] U.S. Cl. ........................................ 341/136; 341/154
[58] Field of Search ................................ 341/154, 144, 341/153, 136

[56] References Cited

U.S. PATENT DOCUMENTS

| | | | |
|---|---|---|---|
| 3,828,345 | 8/1974 | Lode | 341/154 |
| 5,075,677 | 12/1991 | Meuney et al. | 341/136 |

*Primary Examiner*—Brian K. Young
*Attorney, Agent, or Firm*—Iandiorio & Teska

[57] ABSTRACT

An intrinsic R2R resistance ladder digital to analog converter (DAC) includes a plurality of matched semiconductor ladder switches, one in each of the R and 2R legs of the R2R ladder. The ON resistance of each semiconductor switch being matched to constitute the resistance ladder of the DAC; the ladder switches being operated in response to the digital signal input to the DAC; a reference circuit including a reference semiconductor switch matched with the ladder switches responsive to a reference current to generate a reference voltage; and a voltage follower circuit for monitoring the reference voltage and adjusting the current through the ladder switches to match the voltage at each ladder switch with the reference voltage for precisely fixing the DAC analog output current as a proportion of the reference current in dependence upon the operation of the ladder switches by the digital input signal.

6 Claims, 1 Drawing Sheet

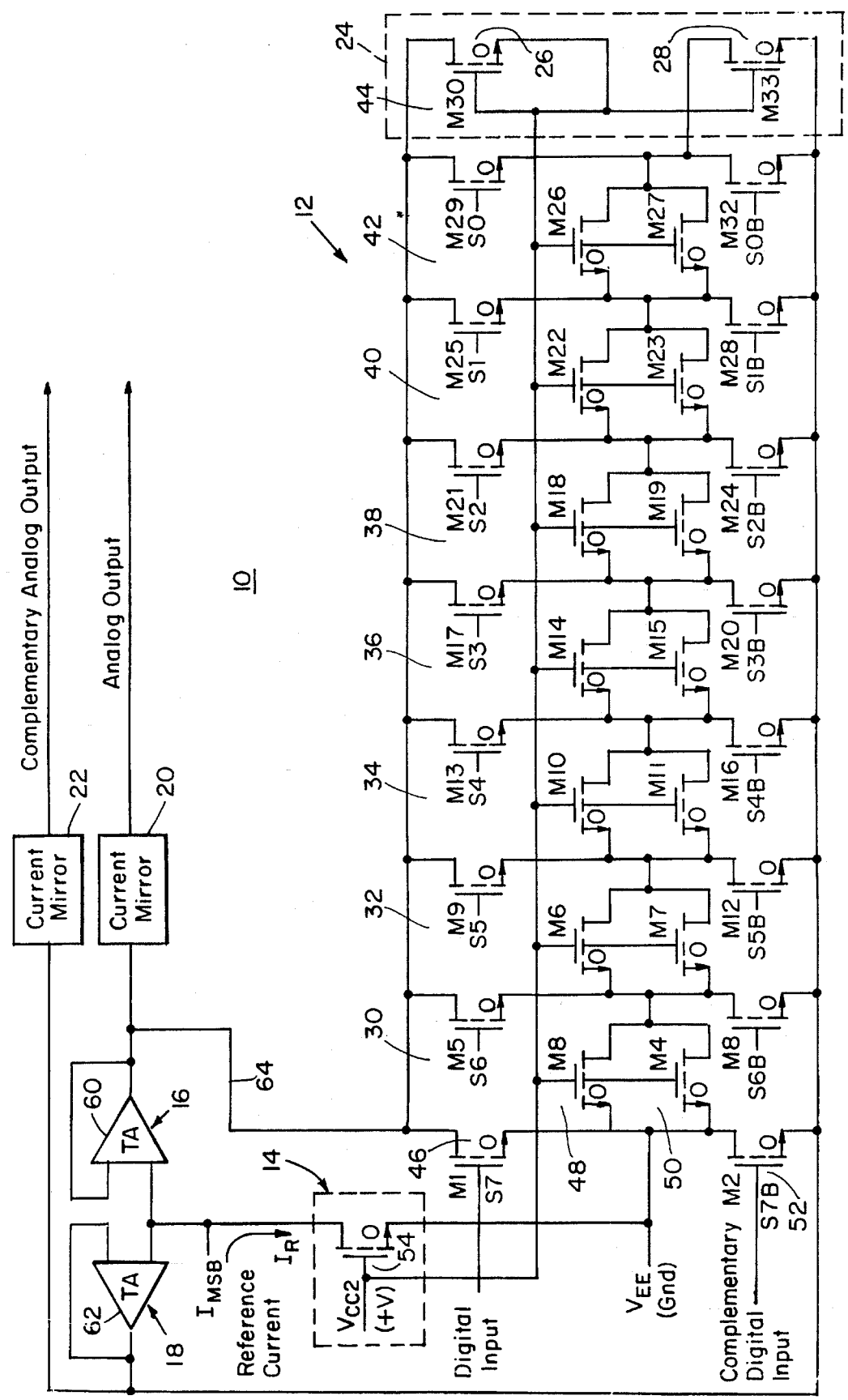

INTRINSIC R2R RESISTANCE LADDER DIGITAL TO ANALOG CONVERTER

FIELD OF INVENTION

This invention relates to an intrinsic R2R resistance ladder digital to analog converter (DAC).

BACKGROUND OF INVENTION

Digital to analog converters (DAC) are widely used in disc drive read channels which require ever greater resolution to meet the increasing demands of data processing. However, increasing the resolution of a DAC introduces certain problems. For example, current source DACs generally double in size for each additional bit added. An alternate form of DAC, the R2R ladder DAC, grows linearly, i.e., it simply adds one more R and one or more 2R resistor pairs for each additional bit of resolution. However, these devices do not have the required precision because the MOS resistors used in the ladder cannot typically be made with the required precision.

SUMMARY OF INVENTION

It is therefore an object of this invention to provide an intrinsic R2R resistance ladder digital to analog converter (DAC).

It is a further object of this invention to provide such an intrinsic R2R resistance ladder digital to analog converter (DAC) which is smaller, more compact, uses fewer components, is more easily scalable to higher resolutions, requires much less chip or silicon area, and is more precise.

The invention results from the realization that a truly precise yet compact digital to analog converter (DAC) can be achieved by employing the intrinsic ON resistance of the semiconductor switches in a 2R2 resistive ladder DAC as the ladder resistances themselves and using a voltage follower circuit to force the voltage across the semiconductor switches to remain constant with respect to the voltage of a reference voltage circuit.

This invention features an intrinsic R2R resistance ladder digital to analog converter (DAC). There is a plurality of matched semiconductor ladder switches one in each of the R2R legs of the R2R ladder; the ON resistance of each semiconductor switch is matched and constitutes the resistance ladder of the DAC. The ladder switches are operated in response to the digital signal input to the DAC. A reference circuit includes a reference semiconductor switch matched with the ladder switches and responsive to a reference current to generate a reference voltage. A voltage follower circuit monitors the reference voltage and adjusts the current to the ladder switches to match the voltage at each ladder switch with the reference voltage for precisely fixing the DAC analog output current as a proportion of the reference current in dependence upon the operation of the ladder switches by the digital input signal.

In a preferred embodiment the semiconductor switches and reference switches are MOS semiconductor switches and they may be MOSFETs. The voltage follower may have its input connected to the reference circuit and its output connected to the ladder switches. There may be a second plurality of matched semiconductor ladder switches matched with each other and with the reference circuit. The DAC may further include a second voltage follower circuit for monitoring the reference voltage and adjusting the current to the second ladder switches to match the voltage in each of the second ladder switches with the reference voltage for precisely fixing the DAC analog output current as a proportion of the reference current in dependence upon the operation of the second ladder switches by the digital input signal.

DESCRIPTION OF THE DRAWING

The FIGURE is a schematic block diagram of an intrinsic R2R ladder digital to analog converter according to this invention.

DISCLOSURE OF PREFERRED EMBODIMENT

Other objects, features and advantages will occur to those skilled in the art from the following description of a preferred embodiment and the accompanying drawing, in which the FIGURE is a schematic block diagram of an intrinsic R2R resistance ladder digital to analog converter according to this invention.

There is shown in the figure a digital to analog converter 10 including an R2R ladder 12, reference circuit 14, two voltage follower circuits 16 and 18 and two current mirror circuits 20 and 22. R2R resistor ladder 12 culminates in a termination resistance circuit 24 which includes a pair of MOSFETs 26, 28 which are biased permanently on. The remainder of ladder 12 includes seven stages 30, 32, 34, 36, 38, 40, 42 and 44 corresponding to an eight bit D/A converter.

Each of the stages, as exemplified by stage 30, includes a MOSFET 46 which functions as a switching device for the digital input and whose ON resistance also functions as the 2R value for the R2R resistance ladder. An identical pair of MOSFETs 48 and 50 connected between stage 30 and stage 32, each of which has an ON resistance of 2R, are connected in parallel to provide the R resistance. A fourth MOSFET 52 provides the complementary switching and 2R value through its ON resistance for the complementary digital input. At any given time, only one of the MOSFETs 46 or 52 will be turned on in stage 30 and so too for each of the other stages 32 through 44. The digital input is provided at the gate of MOSFET 46 and a complementary digital input is provided at the gate of MOSFET 52, while the analog output is provided by current mirror 20 and a complementary analog output is provided by current mirror 22. Reference circuit 14 also includes a MOSFET 54 which is matched to all of the other MOSFETs in all of the other stages as well as those in the termination resistor 24, so that the ON resistances of all the devices are the same. This is accomplished for example by making all of the switching devices on the same silicon chip as MOSFET devices.

Reference circuit 14 receives a reference current which is converted to a reference voltage by MOSFET 54. This voltage drives voltage followers 16 and 18 which may be implemented by transconductance amplifiers 60 and 62. Any change in the voltage at voltage reference circuit 54 is immediately sensed at the input of both transconductance amplifiers 60 and 62. Since the reference current $I_R$ is a constant, any change in voltage reflects a change in resistance such as occurs from a change in temperature. Each of the voltage follower circuits 16 and 18 produces an output on lines 64 and 66, respectively, which adjusts the voltages to both the primary and complementary portions of stages 30–44. Since MOSFET 54 and all of those in the primary and complementary channels in ladder 12 are matched, and since the reference current $I_R$ is fixed, any change in the voltage across MOSFET 54 indicates a change in resistance such as brought about by a change in temperature. By immediately adjusting the voltage on lines 54 and 56, the change in resistance of each of the MOSFETs 46 and 52 in stage 30 and remaining stages 32-44 is also accommodated for equally since they are all matched MOSFETs. This maintains the same current through all of the MOSFETs in all of the stages 30-44 despite changes in the ON resistance due to temperatures or other causes. Thus, the analog outputs from current mirrors 20 and 22 are solely a function of the digital inputs and precisely represent those digital inputs despite changes in temperature and/or the ON resistances of the MOSFETs. Current mirrors 20 and 22 are used because the output currents on lines 64 and 66 from transconductance amplifiers 60 and 62 must flow only and completely into the R2R ladder.

Other embodiments will occur to those skilled in the art and are within the following claims:

What is claimed is:

1. An intrinsic R2R resistance ladder digital to analog converter (DAC) comprising:

a plurality of matched semiconductor ladder switches, one in each of the R and 2R legs of the R2R ladder; the ON resistance of each said semiconductor switch being matched and constituting the resistance ladder of the DAC; said ladder switches being operated in response to a digital signal input to the DAC;

a reference circuit including a reference semiconductor switch matched with said ladder switches and responsive to a reference current to generate a reference voltage; and a voltage follower circuit for monitoring the reference voltage and adjusting the current to said ladder switches to match the voltage at each said second ladder switch with said reference voltage for precisely fixing the DAC analog output current as a proportion of the reference current in dependence upon the operation of said second ladder switches by the digital input signal.

2. The resistance ladder DAC of claim 1 in which said semiconductor switches and reference switch are MOS semiconductor switches.

3. The resistance ladder DAC of claim 1 in which said semiconductor switches and reference switch are MOSFETs.

4. The resistance ladder DAC of claim 1 in which said voltage follower has its input connected to said reference circuit and its output connected to said ladder switches.

5. The resistance ladder DAC of claim 1 further including a second plurality of matched semiconductor ladder switches matched with each other, and with said reference circuit.

6. The resistance ladder DAC of claim 1 further including a second voltage follower circuit for monitoring the reference voltage and adjusting the current to said second ladder switches to match the voltage at each said second ladder switch with said reference voltage for precisely fixing the DAC analog output current as a proportion of the reference current in dependence upon the operation of said second ladder switches by the digital input signal.

* * * * *